United States Patent [19]

Crimmins et al.

[11] 4,010,992
[45] Mar. 8, 1977

[54] LOW PROFILE SOCKET HAVING TERMINAL PINS SEALINGLY MOUNTED IN SOCKET HOUSING

[75] Inventors: David J. Crimmins, Stockton; William Y. Sinclair, Frenchtown, both of N.J.

[73] Assignee: Aries Electronics, Inc., Frenchtown, N.J.

[22] Filed: Jan. 8, 1976

[21] Appl. No.: 647,425

[52] U.S. Cl. .................. 339/17 CF; 339/275 B
[51] Int. Cl.² .................. H01R 13/12
[58] Field of Search ... 339/17 CF, 36, 96, 176 MP, 339/275 B

[56] References Cited

UNITED STATES PATENTS

| | | | |
|---|---|---|---|
| 3,571,779 | 3/1971 | Collier | 339/96 X |
| 3,602,875 | 8/1971 | Pierini | 339/17 CF X |
| 3,673,551 | 6/1972 | McDonough | 339/275 B X |
| 3,732,529 | 5/1973 | Weisenburger | 339/17 CF X |
| 3,818,423 | 6/1974 | McDonough | 339/275 B X |
| 3,918,784 | 11/1975 | Lemke et al. | 339/17 CF X |

*Primary Examiner*—Roy Lake
*Assistant Examiner*—Howard N. Goldberg
*Attorney, Agent, or Firm*—Anthony J. Casella

[57] ABSTRACT

A low profile socket for receiving an electronic multipin package is characterized by having a housing including a plurality of elongated channels, and a corresponding plurality of terminal pins. Each terminal pin includes a receptable portion that is disposed within a channel in the housing, and furthermore includes a post portion which extends from one side of the housing. Each channel includes a flexible membrane portion having an aperture through which the post of the terminal pin extends, with the aperture of the flexible membrane portion being smaller in cross-section than the cross-section of the post. Accordingly, when the terminal pin is fully inserted in the housing, the flexible membrane portion is flexed or stretched, and thereby forms a fluid type seal with the terminal post, thereby restricing liquid or foam flux and solder from entering the channel of the socket when the socket is being connected, such as by wave soldering, to the associated printed circuit board.

12 Claims, 8 Drawing Figures

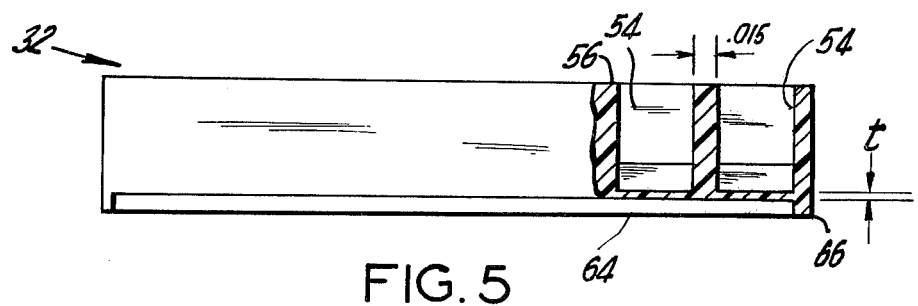
FIG. 5
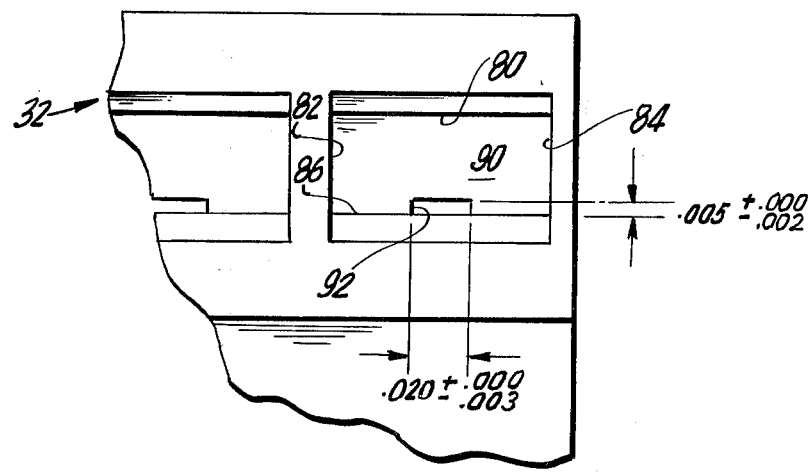
FIG. 6
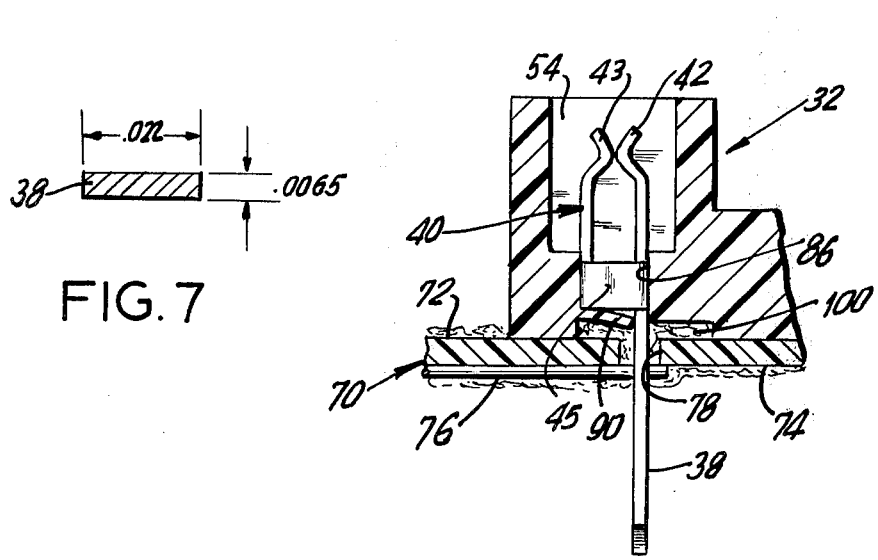
FIG. 7
FIG. 8

LOW PROFILE SOCKET HAVING TERMINAL PINS SEALINGLY MOUNTED IN SOCKET HOUSING

The subject invention relates to a low profile socket for receiving an electronic multi-pin package such as, for example, a dual-in-line integrated circuit package. More particularly, the subject invention provides a new and improved low profile socket which is particularly suited to applications wherein the socket is to be soldered to a printed circuit board. In such applications it is most important that the fluid or foam flux be prevented from entering the channels within the socket, since the contamination of the channels with flux material could cause high impedance short circuits between two terminal pins, as well as possibly insulating the contact area and thus could affect the sophisticated electronics systems in which the socket is employed, as well as the ability to remove and replace the electronic multi-pin package.

Miniaturized circuits have been used for some time and are employed on an ever increasing scale in complex electronics equipment. Technology has advanced so that it is now common practice to use what has become known as integrated circuits, or physically small units containing an entire circuit rather than a single electronic element, and to mount these units or integrated circuits packages on printed circuit boards. It was early practice to solder pins or terminals projecting from these integrated circuit packages directly to points on the integrated circuit board or to mount the packages on a dielectric board so that the pins or terminals extend through the board for connection to conductors.

It is now more common and desirable to mount integrated circuit packages on a terminal board or printed circuit board so that the packages can be easily removed in order to exchange them. Accordingly, sockets are now provided for use with the packages, these sockets including dielectric housings which support terminals having electrical contacts for receiving the pins of the packages. In some sockets, the terminals have long posts which extend from the lower part of the housing for insertion through holes in the printed circuit board. When the socket is mounted in place on the circuit board, the posts extend to the back of the printed circuit board and may be connected, such as by a wave soldering technique, to the printed circuit lead lines disposed on the printed circuit board.

There are several attributes considered desirable in a socket including a fluid or foam sealing connection of the terminal pins mounted in the socket housing, so that during the process of soldering the socket terminal posts to the printed circuit board, no solder flux foam or liquid seeps through the opening in the housing through which the post extends and accumulates in the channel in which the terminal pin receptacle is disposed. Heretofore, each channel in the socket has been of rigid side wall and rigid base construction, with an aperture being provided in the base, and the dimensions of said aperture being as close as possible to the cross-sectional dimension of the terminal post. Nonetheless, even the slight clearance between the terminal post and the aperture in a channel has resulted in a minute passageway which, when solder flux foam or liquid is present, acts as a capillary tube in drawing the solder flux into the cavity. As can readily be appreciated, since the pins of the integrated circuit pack are accommodated in the channels, the presence of the solder flux could cause the establishment of a high impedence short circuit path between two pins, and of course could disrupt the operation of the sophisticated electronics system in which the integrated circuit pack is embodied. Still further, the presence of flux in the channel may affect the ease of inserting and removing of the integrated circuit pack from the package, and could also result in the integrated circuit pack being fixedly bonded to the terminals of the socket, thereby obviating the primary objective in the use of a socket which is to enable the easy mounting and easy removal of an integrated circuit pack onto a printed circuit board. Another desirable attribute of a socket is restricted entry of pins into the socket openings, (i.e., a socket opening which is smaller than the pin but which just accepts the correct size of pin on a package), thereby preventing the inadvertent damaging of the terminal receptacle when probes or the like are inadvertently inserted into the channels. At least the preferred embodiment of the present invention seeks to provide all of the desirable attributes in a single socket.

According to the present invention, a socket for receiving an electronic multi-pin package comprises an elongated housing having a plurality of channels extending therethrough, and a corresponding plurality of terminals. Each of the terminals includes a post portion received within a respective one of said channels and extending from the one side of the housing, usually the bottom portion thereof, and each terminal also includes a receptacle portion disposed within the respective channel for engaging a pin of the multi-pin package. Each of the channels of the housing is defined by rigid upstanding wall portions for engaging and maintaining the receptacle portion of the terminal in the channel, and with the lower portion of each channel being defined by a flexible membrane base having an aperture therein. The cross-section of the aperture is less than the cross-section of the terminal post portion, prior to the terminal post being inserted into the elongated housing. When the terminal is fully assembled into the channel, the membrane base thereof deforms downwardly, and effectively stretches, whereby the resilient memory of the thin flexible membrane continuously forms a biasing force against the terminal post, thereby forming a fluid or foam seal. As is readily apparent, when the socket of the subject invention is mounted on a printed circuit board, and the terminal posts are wave soldered to the printed circuit board because of the sealing between the flexible membrane bases of the channels of the socket, and the terminal posts, none of the solder flux foam or fluid enters the elongated channels in the socket. Furthermore, upon subsequent heating of the solder, a greater sealing bond is achieved between the plastic membrane of the socket and the terminal post, thereby insuring the continued proper operation of the socket.

In a preferred embodiment of the subject socket, the socket may also include a removable cover member having restricted openings corresponding to the channels in the elongated housing of the socket. Furthermore the elongated housing may be provided with stand-offs extending from the lower side of the housing, from which the terminal posts extend, in order to provide a space between the socket and the printed circuit board which is desirable during the cleaning operation, following soldering of the socket to the printed circuit board.

Further objects and advantages of the subject invention will become apparent from a reading of the following detailed description, taken in conjunction with the drawings, in which:

FIG. 5 is a view taken along line 5—5 in FIG. 3;

FIG. 6 is a detailed plan view of a channel of the elongated housing of the subject invention;

FIG. 7 is a cross-sectional view of a terminal post, as taken along line 7—7 in FIG. 2; and FIG. 8 is a cross-section view illustrating the mounting of the subject invention onto a printed circuit board during a wave soldering operation.

PRIOR ART

Figure 1:
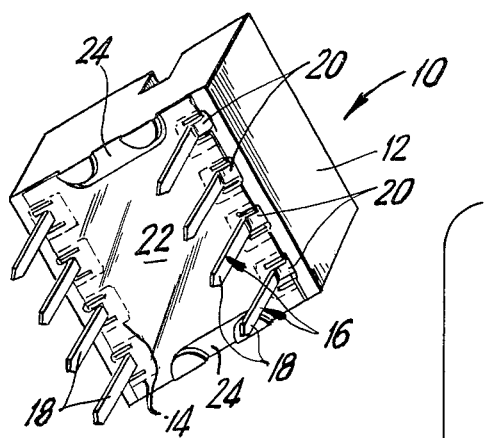
FIG. 1 is a perspective view of a prior art socket of conventional design including an additional sheet of plastic material intended to minimize the amount of solder flux drawn into the channels of the socket.

FIG. 1 illustrates a prior art socket, as viewed from a perspective bottom view, with the prior art socket being generally designated by the numeral 10. Socket 10 includes a housing 12, made of a dielectric material, and extending through the housing 12 are a plurality of through channels 14, with FIG. 1 illustrating in dotted lines the dimensions of the lower portions of the channels 14. Disposed in said channels are a corresponding plurality of terminal post portions 18. The terminal posts are bent adjacent the bottom of the housing 12 into U-shaped portions 20 that engage a separate sheet of plastic material, designated by the numeral 22. The sheet of plastic material 22 is held in position by means of the U-shaped bends 20 of the posts 18, and the sheet of plastic 22 includes cut-out portions for accommodating the stand-offs 24 of the socket 10. It is the purpose of the plastic sheet 22, and the bends 20 in the posts 18 to inhibit solder flux or foam from entering the channels 14, thereby possibly affecting the operation of the socket and the integrated circuit intended to be mounted in the socket 10. As is readily apparent, considering the miniaturization of the socket and the components thereof, any discrepancy in the mounting of the plastic sheet 22 may result in solder flux or foam from entering the channels 14. In addition, the cost of manufacture of said socket is increased by the additional assembly operation of the separate sheet of plastic material 22, and the bending of the posts 18, as well as the material cost associated with the additional element in the form of a separate sheet of plastic 22. Still further, since the separate sheet of plastic material 22 is a distinct and discrete element from the housing 12, unless the sheet is in intimate contact with the housing 12, seepage of the flux through the openings between the sheet 22 and the housing 12 is difficult to prevent. The shortcomings of the prior art are overcome by the subject invention, as will be more fully understood from the following detailed description of FIGS. 2 through 8 which illustrates the subject invention.

DETAILED DESCRIPTION OF THE PREFERRED EMBODIMENTS

The socket 30 of the subject invention which is adapted to receive an electronic multi-pin package basically comprising an elongated housing 32 and a plurality of terminals 34. As an alternative embodiment, the socket may include a cover 36.

Each terminal is of integral construction and includes a post portion 38 and a receptacle portion 40. Each post 38 may be a solid conductive member of generally rectangular cross-section, whereas the receptacle 40 may be composed of a relatively thin conductive member formed in the shape shown from a flat blank and including a relatively broad, inwardly biased resilient broad blade 42 that extends upwardly and inwardly and, as it nears the receptacle opening, flares outwardly. Opposite the broad blade 42 are two flat spring contacts 43 and 44, of similar shape, and also inwardly biased but free to move individually and independently of one another. The spring blade contacts are attached to the broad contact 42 by narrow connecting members 45 extending between each of the contacts 43 and 44 and the broad blade 42. Preferably, receptacle 40 is formed from a single blank, originally flat, by bending operations. Preferably, the metal used for the terminals 34 has sufficient resiliency to permit limited deflection of the contact blades 42, 43, 44 without exceeding the fatigue resistance of the connecting members upon repeated limited deflections, as integrated circuit packs are inserted and removed from the socket 30.

Figure 2:
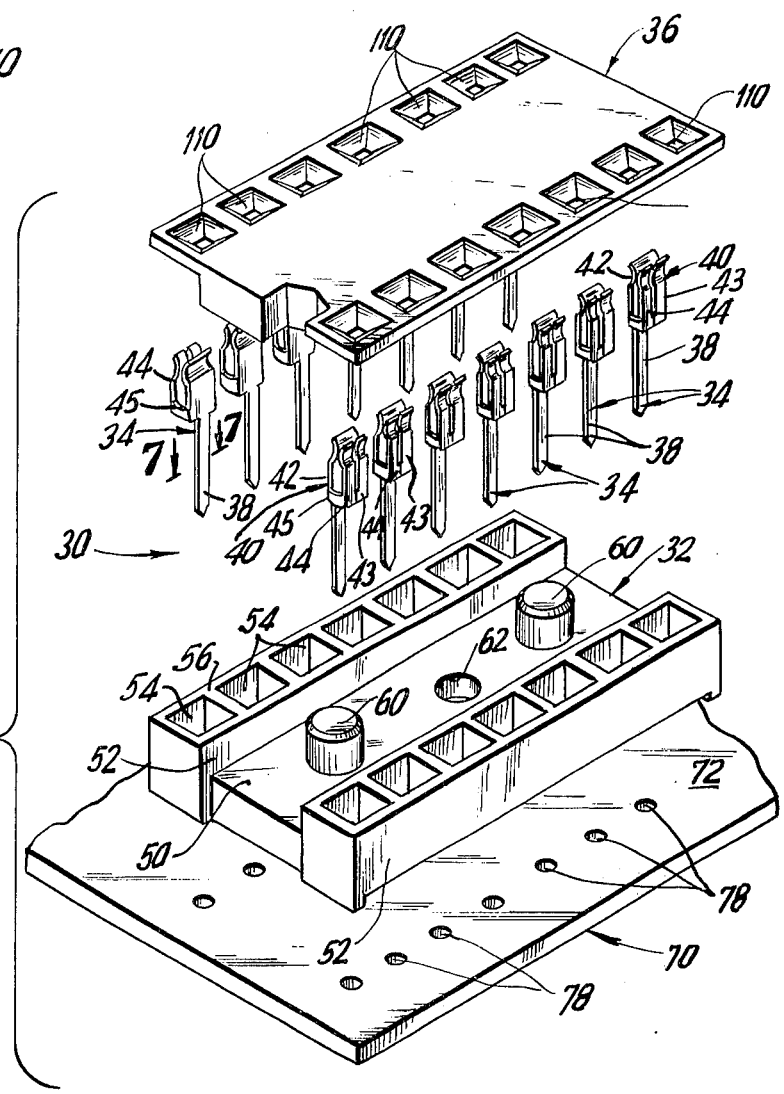
FIG. 2 is an exploded perspective view of a preferred embodiment of the subject socket.
Figure 3:
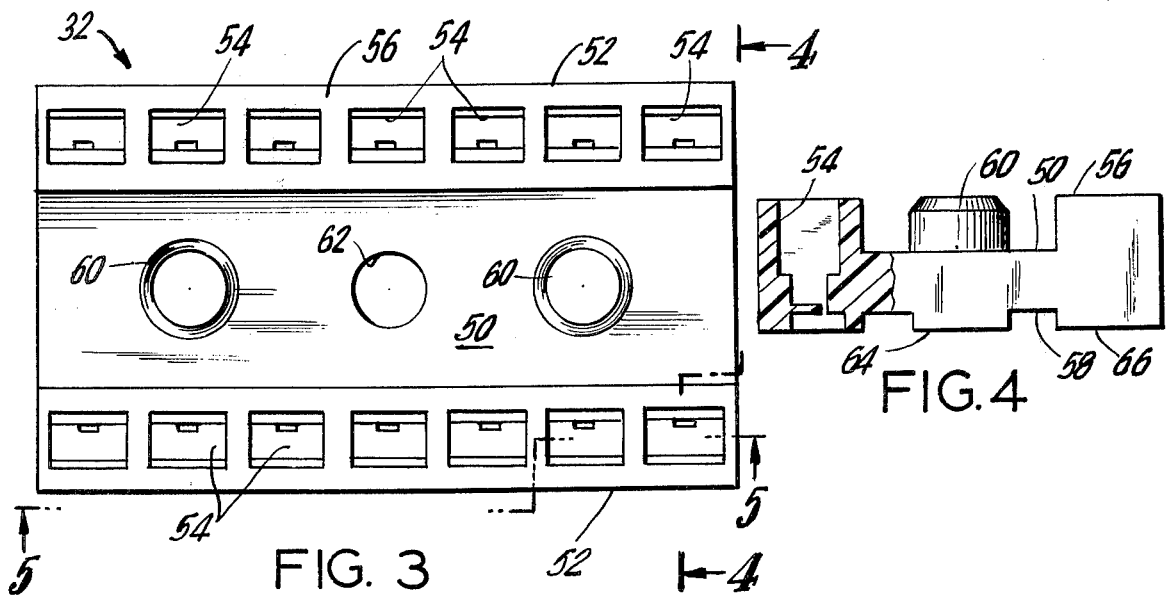
FIG. 3 is a plan view of the elongated housing of the subject socket.
Figure 4:
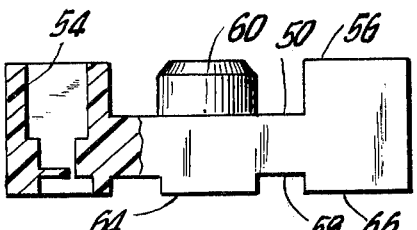
FIG. 4 is a view taken along line 4—4 in FIG. 3, and including a terminal pin mounted in the elongated housing of the subject socket.

Referring to FIGS. 2, 3 and 4, the elongated housing 32 is of generally rectangular construction, and is made of a dielectric material, such as plastic. Housing 32 includes a longitudinally extending recessed central portion 50, and long sides 52, 52 each including a plurality of through channels 54 extending from the upper surface 56 to the lower surface 58 of the housing 32. Disposed on the upper surface 56, and preferably formed integral therewith are a pair of projections 60, 60 which are adapted to cooperate with similarly configured slots in the cover 36 for frictionally connecting the cover and elongated housing.

A central aperture 62 extends through the recessed portion 50 of the housing 32 through which fastening means such a screw, rivet, etc., may be passed for fixedly connecting the socket 10 to a printed circuit board, designated by numeral 70 in FIG. 2.

Extending from the lower surface 58 of the elongated housing 32 is a central elongated stand-off 64, as well as corner stand-offs 66, disposed in each of the four corners of the elongated housing 32. The purpose of the stand-offs 64 and 66 is to provide a clearance space between the upper surface 72 of the printed circuit board and the lower surface 58 of the elongated housing 32 in the vicinity of the terminal posts 38, thereby enabling the completely assembled printed circuit board to be cleaned (either by dipping or other similar process) of the solder flux, after the terminals 38 have been soldered to the electrical leads 76 disposed on the lower surface 74 of the printed circuit board (see FIG. 8), as more fully described hereinafter. note that posts 38 extend through holes 78 in printed circuit board 70.

Referring in particular to FIGS. 3, 4, 5 and 6, it is noted that each of the elongated channels 54 of the housing 32 includes rigid side wall portions 80, 82, 84, 86 which are of reduced size adjacent the lower surface of the housing 32, with the reduced size portion being provided to engage the receptacle 40 of each terminal 34. The base of each channel 54 is defined by a flexible membrane portion, designated by a numeral 90 which is preferably formed unitary with the elongated, dielectric plastic housing 32, which membrane 90 includes an aperture 92, one side of which is defined by the rigid upstanding wall 86 of the channel 54. The other three sides of the aperture 92 are disposed in the flexible membrane member 90. As more particularly shown in FIG. 6, the configuration of the aperture corresponds to the configuration of the cross-section of the terminal post 38 of the terminal 34 (see FIG. 7), however, the aperture 92, in the membrane 90 is smaller is cross-sectional size than the cross-sectional size of the terminal post 38. For example, as shown in FIG. 6, the cross-sectional size in inches of the aperture 92 may be on the order of 0.005 (+0.000, −0.002) by 0.020 (+0.000, −0.003), whereas the cross-sectional size of the terminal post 38 is on the order of 0.0065 by 0.022. The thickness $t$ of the flexible membrane 90 (see FIG. 5) is on the order of 0.002 to 0.006. This is to be contrasted to the thickness of the upstanding rigid wall members 80–86 of the channels 54 which are on the order of 0.015 inches thick.

As illustrated in FIG. 8, when the terminal 34 is inserted into the channel 54, because of the differential in the cross-sectional size of the terminal post 38 and the aperture 92, the flexible membrane 90 is effectively stretched and bent downwardly, and since it is made of a flexible plastic material, it forms a tight sealing connection to the terminal post 38. The sealing connection is sufficient to effectively close off the aperture 92, thereby preventing solder flux foam or fluid from entering the cavity 54.

FIG. 8 illustrates in cross-section one of the stages in which the terminal post 38 of terminal 34 is soldered to a lead 76 disposed on the lower surface 74 of the printed circuit board 70. The foam flux has been applied and is designated by the numeral 100, and the assembly is in position preparatory for the step of wave soldering the apparatus. Since the openings 78 in the printed circuit board 70 are necessarily larger than the posts 38 of the terminals 34, the flux 100 passes from the lower surface 74 to the upper surface 72 of the printed circuit board 70, and accumulates in the clearance resulting from the stand-offs 64, 66 of the housing 32. Next, the connection is wave soldered, and during the course of the wave soldering the heat of the dielectric plastic material of the housing 32 causes the plastic membrane 90 to achieve a more effective sealing bond with the terminal post 38. The fluid sealing of the terminal post 38 is also important after the wave soldering step is completed, and the printed circuit board with the attached socket 30 is then dipped into a cleaning bath for removal of the excess flux foam or liquid 100.

As indicated above, if desired, the socket 30 of the subject invention may be provided with a cover 36 including a plurality of tapered openings 110 which are aligned with the channels 54 of the housing 32. Openings 110 are preferably tapered so as to provide restricted entry of the pins of the integrated circuit pack, with the tapered openings 110 also aiding in the alignment of the pins, and furthermore preventing the assembler of the apparatus from inadvertently placing a large probe between the blades 42, 43, 44 of the receptacle 40, which could result in damage to the blades.

Accordingly, there is provided a new and improved socket, which is of low profile design, low profile being the total height of the socket above the upper surface 72 of the printed circuit board 70, which socket includes a housing of unitary construction including channel members, each having a flexible base including an aperture which is of a size less than the size of the terminal post of the terminals. The flexible membrane forming the base of each channel is sufficiently flexible whereby, when the terminals are fully inserted, the flexible membrane is deformed and stretched, with the elastic memory of said flexible membrane being sufficient to form a fluid type seal around the terminal post, thereby preventing flux from entering the channel 54.

Although the invention has been described with reference to preferred embodiments, numerous modifications and variations in form and detail, might occur to those skilled in the art. Accordingly, all such modifications and variations are intended to be included within the scope and spirit of the appended claims.

What is claimed is:

1. A socket for receiving an electronic multi-pin package comprising an elongated housing having the plurality of channels extending therethrough and a plurality of terminals;

each terminal including (1) a post portion received within a respective one of said channels and extending from one side of the housing, and (2) a receptacle portion disposed within said respective channel for engaging a pin of said multi-pin package;

each said channel in said housing defined by (1) rigid upstanding wall portions for engaging the sides of said receptacle portion of the terminal, and (2) a flexible membrane base having an aperture therein, with the cross-section of said aperture being less than the cross-section of said terminal post portion whereby, when the terminal post portion is fully assembled in said channel, the membrane base thereof deforms downwardly to sealingly engage the terminal.

2. A socket for receiving an electronic multi-pin package as in claim 1 wherein said housing includes a plurality of stand-offs disposed on said one side of said housing.

3. A socket for receiving an electronic multi-pin package as in claim 1 wherein said socket is of unitary construction.

4. A socket for receiving an electronic multi-pin package as in claim 3 wherein said socket is made of plastic material.

5. A socket for receiving an electronic multi-pin package as in claim 1 wherein said socket further includes a cover having a plurality of openings aligned with said channels in the housing.

6. A socket for receiving an electronic multi-pin package as in claim 5 wherein each of said openings in the cover is tapered to provide restricted entry to the channels within the housing.

7. A socket for receiving an electronic multi-pin package as in claim 1 wherein each of said channels has a reduced cross-sectional area adjacent the membrane base for engaging the receptacle portion of the terminal.

8. A socket for receiving an electronic multi-pin package comprising an elongated housing having a plurality of channels extending therethrough, a corresponding plurality of terminals, and a cover wherein:

each terminal includes (1) a post portion received within a respective one of said channels and extending from one side of the housing, and (2) a receptacle portion disposed within said corresponding channel for engaging a pin of said multi-pin package;

each said channel in said housing including (1) rigid wall portions for engaging the sides of said receptacle portion of the terminal, and (2) a flexible membrane base having an aperture therein, with the cross-section of said aperture being less than the cross-section of said terminal post portion prior to insertion of said terminal into said channel; and said cover frictional engages said housing and includes a plurality of tapered openings aligned with the channels within said housing.

9. A socket for receiving an electronic multi-pin package as in claim 8 within said socket is made of plastic material.

10. A socket for receiving an electronic multi-pin package as in claim 8 wherein said housing further includes a plurality of stand-offs disposed on said one side of said housing.

11. A socket for receiving an electronic multi-pin package as in claim 8 wherein each channel has rigid upstanding wall portions, and is of reduced cross-sectional area adjacent the membrane base thereof, with said membrane base extending about three sides of said terminal post portion whereby, when the terminal is fully inserted in said channel, the membrane base flexes downwardly and sealingly engages the terminal post.

12. A socket for receiving an electronic multi-pin package as in claim 8 wherein each of said openings in the cover are tapered to provide restricted entry to the channels within the housing.

* * * * *